United States Patent
Levin

(10) Patent No.: US 7,154,301 B2
(45) Date of Patent: Dec. 26, 2006

(54) APPARATUS AND METHOD FOR A LOW JITTER PREDRIVER FOR DIFFERENTIAL OUTPUT DRIVERS

(75) Inventor: Alexander Levin, Port Orchard, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/811,032

(22) Filed: Mar. 26, 2004

(65) Prior Publication Data

US 2005/0212561 A1 Sep. 29, 2005

(51) Int. Cl.
*H03K 19/0175* (2006.01)
(52) U.S. Cl. .............................. 326/86; 326/82; 326/90; 326/126
(58) Field of Classification Search ............ 326/82–83, 326/86, 115, 126–127, 90
See application file for complete search history.

(56) References Cited

U.S. PATENT DOCUMENTS

| 5,959,492 A | * | 9/1999 | Khoury et al. ............... 327/389 |
| 6,222,388 B1 | * | 4/2001 | Bridgewater, Jr. ........... 326/86 |
| 6,407,590 B1 | * | 6/2002 | Bass ........................... 327/55 |
| 6,566,950 B1 | * | 5/2003 | Rokhsaz ..................... 330/253 |
| 6,617,891 B1 | * | 9/2003 | Srikanth et al. ............. 327/108 |
| 6,894,536 B1 | * | 5/2005 | Martin et al. ................ 326/63 |

\* cited by examiner

*Primary Examiner*—Anh Q. Tran
(74) *Attorney, Agent, or Firm*—Blakely, Sokoloff, Taylor & Zafman LLP

(57) ABSTRACT

A method and apparatus for a low jitter predriver for differential output drivers. In one embodiment, the predriver comprises a pull-up circuit having at least one pull-up device of a first device type and a pull-down circuit having at least one pull-down device of the first device type In one embodiment, the pull-up circuit and the pull-down circuit to charge an output node and a complement output node in opposite directions to generate a differential predriver signal pair. Accordingly, using the pull-up and pull-down circuits, the predriver circuit generates differential output signals. In one embodiment, the pull-up device and the pull-down device comprise N-channel metal oxide semiconductor (NMOS) devices. Other embodiments are described and claimed.

31 Claims, 6 Drawing Sheets

APPARATUS AND METHOD FOR A LOW JITTER PREDRIVER FOR DIFFERENTIAL OUTPUT DRIVERS

FIELD OF THE INVENTION

One or more embodiments of the invention relate generally to the field of integrated circuit and computer system design. More particularly, one or more of the embodiments of the invention relates to a method and apparatus for a low jitter predriver for differential output drivers.

BACKGROUND OF THE INVENTION

High speed serial differential interfaces depend on extremely low output jitter to maintain error-free (or low bit-error rate) communication. Common mode voltage fluctuation of the output differential signals also presents a problem since receiver circuitry requires a stable, common mode input voltage for optimal performance. Conventionally, current mode differential output drivers are limited in architecture, generally consisting of a simple current source and switches which channel current to either a data input line or a complementary data input line.

Differential output drivers generally work in conjunction with predriver circuitry. The predriver is generally responsible for opening and closing the switch devices of the output drivers. Generally, the output signals from the predriver, which open/close the switches of the line driver, must maintain a crossover point that is both stable in voltage and time. Any temporal variation of the crossover point would translate directly into line driver output jitter.

Conventionally, line driver output jitter is primarily caused by sensitivity to voltage ($V_{cc}$) fluctuation which speeds up or slows down the transition of the predriver signals. Voltage variation of the crossover point will have a lesser effect on output jitter; but it will produce undesirable common mode variation during the transition of the output signals. Conventional ground reference differential line drivers generally use P-channel metal oxide semiconductors (PMOS) switches to pull-up node voltages to drive differential output signals.

BRIEF DESCRIPTION OF THE DRAWINGS

The various embodiments of the present invention are illustrated by way of example, and not by way of limitation, in the figures of the accompanying drawings and in which.

DETAILED DESCRIPTION

A method and apparatus for a low jitter predriver for differential output drivers are described. In one embodiment, the predriver comprises a first pair of cross-coupled devices to receive a data input signal. In addition, a second pair of cross-coupled devices receive a complement data input signal. The first and second cross-coupled devices are used to charge an output node and a complement output node in opposite directions to generate a differential predriver signal pair. In one embodiment, the circuit differential predriver signals pair to open/close a pair of output driver switches to generate a differential output driver signal pair. In one embodiment, the first and second pair of cross-couple devices comprise N-channel metal oxide semiconductor (NMOS) devices.

In the following description, numerous specific details such as logic implementations, sizes and names of signals and buses, types and interrelationships of system components, and logic partitioning/integration choices are set forth to provide a more thorough understanding. It should be appreciated, however, that the invention may be practiced without such specific details. In other instances, control structures and gate level circuits have not been shown in detail to avoid obscuring the embodiments of the invention. Those of ordinary skill in the art, with the included descriptions, will be able to implement appropriate logic circuits without undue experimentation.

In the following description, certain terminology is used to describe various embodiments. For example, the term "logic" is representative of hardware and/or software configured to perform one or more functions. For instance, examples of "hardware" include, but are not limited or restricted to, an integrated circuit, a finite state machine or even combinatorial logic. The integrated circuit may take the form of a processor such as a microprocessor, application specific integrated circuit, a digital signal processor, a microcontroller, or the like.

Figure 1:
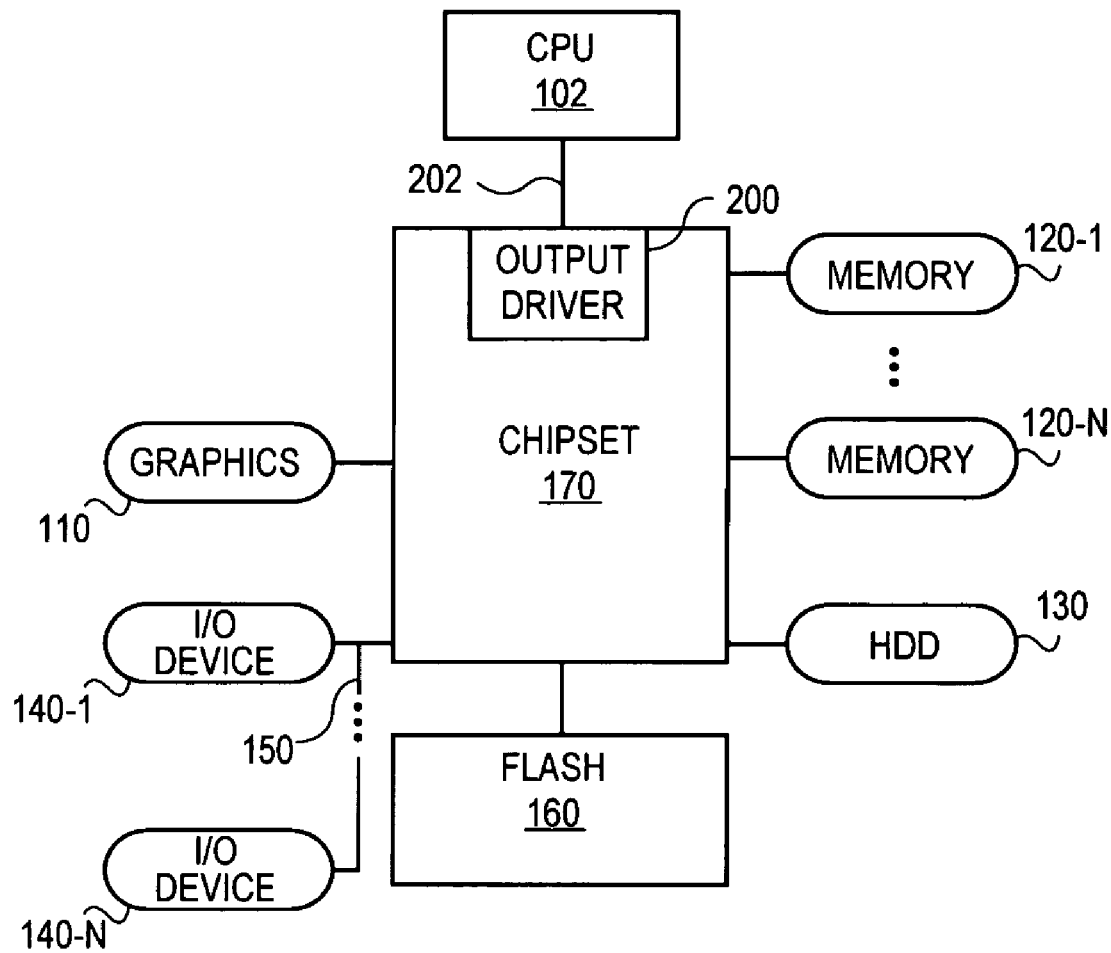
FIG. 1 is a block diagram illustrating a computer system including a low jitter predriver for a differential output driver, in accordance with one embodiment.

FIG. 1 is a block diagram illustrating computer system 100 including differential output driver 200 utilizing a predriver to limit signal crossover point variations and jitter to produce a low signal swing appropriate for turning on line driver switches to generate a differential output driver signal pair. Representatively, computer system 100 comprises a processor system interconnect (bus) 202 for communicating information between processor (CPU) 102 and chipset 170. As described herein, the term "chipset" is used in a manner to collectively describe the various devices coupled to CPU 102 to perform desired system functionality.

Representatively, chipset 170 may provide an interface or control for graphics block 110, such as, for example, a graphics chipset, as well as hard drive devices (HDD) 130 and main memory 120. In one embodiment, chipset 170 is configured to include a memory controller and/or an input/output (I/O) controller. In an alternate embodiment, chipset 200 is or may be configured to operate as or include a system controller. In one embodiment, main memory 120 (120-1, ... 120-N) may include, but is not limited to, random access memory (RAM), dynamic RAM (DRAM), static RAM (SRAM), synchronous DRAM (SDRAM), double data rate (DDR) SDRAM (DDR-SDRAM), Rambus DRAM (RDRAM) or any device capable of supporting high-speed buffering of data.

High-speed serial differential interfaces depend on extremely low output jitter to maintain error free (or low bit-error rate) communication. Common mode voltage fluctuation of the output differential signals also presents a problem, since receiver circuitry requires a stable common mode input voltage for optimal performance. Current mode differential output drivers are limited in architecture, generally consisting of a simple current source, and switches which channel current to either the positive/negative data lines. Pre-driver circuitry offers one of the few areas for improving circuit architecture to achieve low output jitter and common mode stability.

Figure 2:
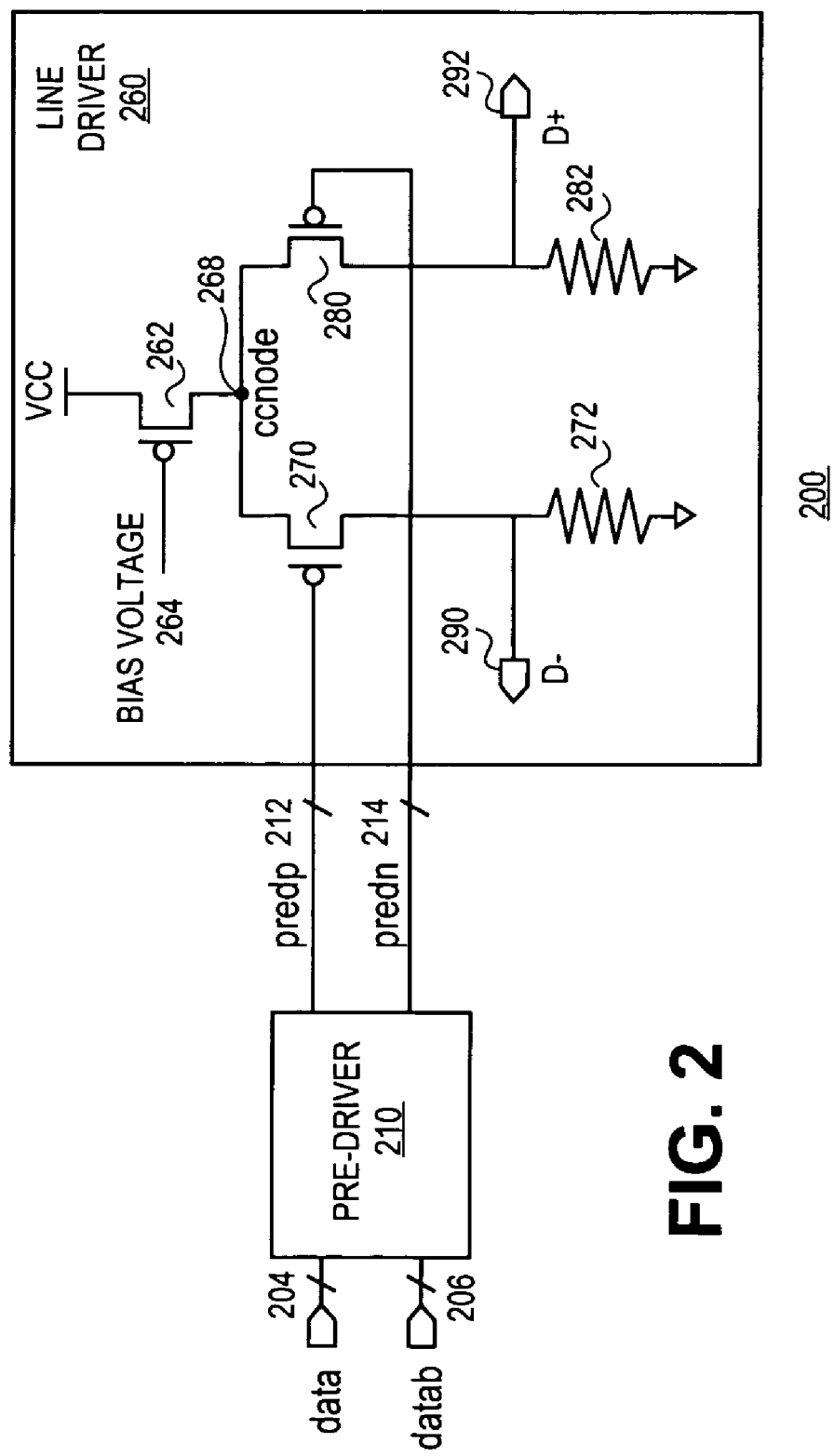
FIG. 2 is a block diagram further illustrating the output driver of FIG. 1, in accordance with one embodiment.

FIG. 2 further illustrates differential output driver 200 of FIG. 1, in accordance with one embodiment. Representatively, predriver 210 is responsible for opening or closing switch devices (270, 280) of line driver 260. In one embodiment, line driver 260 includes PMOS device 262 which operates as a constant current device. Accordingly, by applying bias voltage 264, PMOS device 262 operates in a saturation region so long as a voltage at ccnode 268 (Vccnode) is within a threshold voltage (Vt) of bias voltage 264, or lower, to generate a current in the range of 20 milli-amps (mA). Accordingly, to maintain saturation of device 262, there is a make-before-break connection between switches 270 and 280. As a result, switches 270 and 280 should never simultaneously shut-off. Furthermore, output pads 290 and 292 represent pins going external from output driver 200 off-chip, and on to a motherboard.

In one embodiment, differential line driver 260 uses P-channel metal oxide semiconductor (PMOS) switches (270 and 280) which turn on when the gate voltage falls to more than a threshold drop (Vt) below the drain voltage of driver current source (ccnode 268) (see FIG. 5). The switches' resistance continues to lower as the predriver signal to the driver gate voltage falls to ground. However, in the opposite direction, the predriver signal raises the switch resistance only until it crosses within a Vt drop of the driver's ccnode voltage. As illustrated by turn-off margin 320 of FIG. 5, additional voltage swing up and beyond that point does nothing further to turn off the switch, but will continue to capacitively impart energy onto the output pad (290/292) and the ccnode 268. Accordingly, in one embodiment, pull-up of predp signal 212 and predn signal 214 is limited to a maximum voltage equal to Vccnode (see FIG. 5).

Because the line driver switches (270 and 280) are large (to achieve low resistance), and predriver slew rates are necessarily fast to open and close switches 270 and 280 according to data rate requirements, the control of predriver rise/fall time is essential to maintain a stable output common mode voltage. Switch devices 270 and 280 capacitively couple unbalanced energy from the predriver output to ccnode 268 and output pads 290 and 292. Ideally, current (e.g., 20 milli-amps) from device 262 develops voltage across either resistor 272 or 282 depending on whether switch 270 or 280 is open. Any additional current introduced through capacitive coupling mechanisms is undesirable. Matched and aligned predriver signals are needed to minimize the disturbance of the output common mode voltage.

In one embodiment, output signals (predp 212, predn 214) from predriver 210, which open/close switches 270 and 280 of line driver 260, maintain a stable crossover point in both voltage and time. Any temporal variation of the crossover point will translate directly into line driver output jitter. Jitter is primarily caused by sensitivity to Vcc fluctuation which speeds up or slows down the transition of predriver signals 212 and 214. Voltage variation of the crossover point will have a lesser effect on output jitter (up to Vcc/3), but it will produce undesirable common mode variation on the output signals. Accordingly, in one embodiment, predriver 210 is designed to constrain the output crossover point within a limited low-voltage range, and will impart minimal jitter into the output data stream, as illustrated in FIG. 3.

Figure 3:
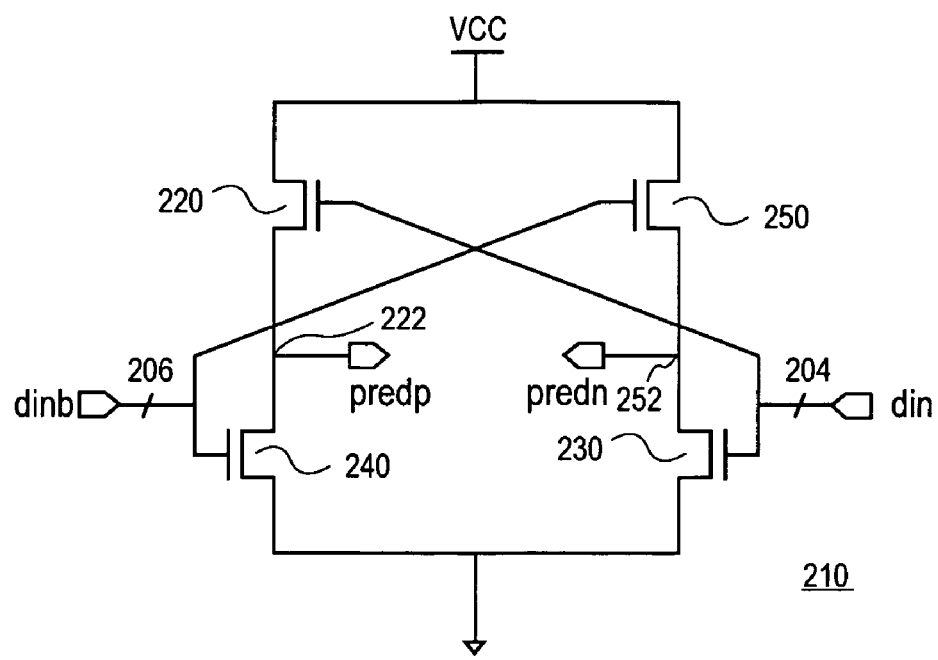
FIG. 3 is a block diagram further illustrating a predriver of FIG. 2, in accordance with one embodiment.

FIG. 3 illustrates an embodiment of predriver 210 designed according to a newly developed circuit topology to limit signal crossover point variation, jitter, and to produce a low swing signal appropriate for tuning on line driver PMOS switches 270 and 280. In one embodiment, predriver 210 is comprised of a pull-down circuit including a pair of NMOS pull-down devices (230 and 240) which can drive a low output level, and a pull-up circuit including a pair of pull-up NMOS devices (220 and 250), which pull up the predriver output signals to the high output level.

As described herein, NMOS devices 220 and 230 may be referred to as a first pair of cross-coupled devices to receive a data input signal (din 204). Likewise, NMOS devices 240 and 250 may be referred to as a second pair of cross-coupled devices to receive a complement data input signal (dinb 206). Accordingly, when a signal transition (rising/falling) is indicated by din signal 204 and dinb signal 206, predriver 210 causes a switching event of the state of the predp signal 222 and predn signal 252.

In one embodiment, in response to the switching event, first pair of cross-coupled devices 220 and 230 and second pair of cross-coupled devices 240 and 250 will charge output node 222 and complement output node 252 in opposite directions to generate differential predrivers signal pair predp 212 and predn 214. In other words, to drive the predriver output signal "predp" high, a voltage of Vcc is applied to the gate of the NMOS device 220 above the predp output node 222. As the input signal rises, NMOS pull-up device 220 conducts as long as its gate to source voltage exceeds Vt. Once the signal rises to a voltage of Vcc-Vt, the device 220 stops conducting, and the voltage at predp output node 222 ceases to rise. Accordingly, because NMOS devices are used to drive the signal high, the signal swing is restricted to a maximum voltage of Vcc-Vt.

The pulldown event is similar to complementary metal oxide semiconductor (CMOS) functionality. Representatively, NMOS device 240 turns on as its input gate is driven high by dinb signal 206, and predp signal 212 is pulled to ground. Concurrently, NMOS device 220 turns off as the input (din signal 204) to its gate falls to ground. Predriver 210 is superior to a simple CMOS inverter, in that the gates of the devices attached to the predp node 222 and predn 252 nodes are charged in opposite directions during a switching event (differential signal transition). The net capacitive charge transfer to the predn/predp nodes is nearly zero, allowing a fast output edge rate.

Figure 4:
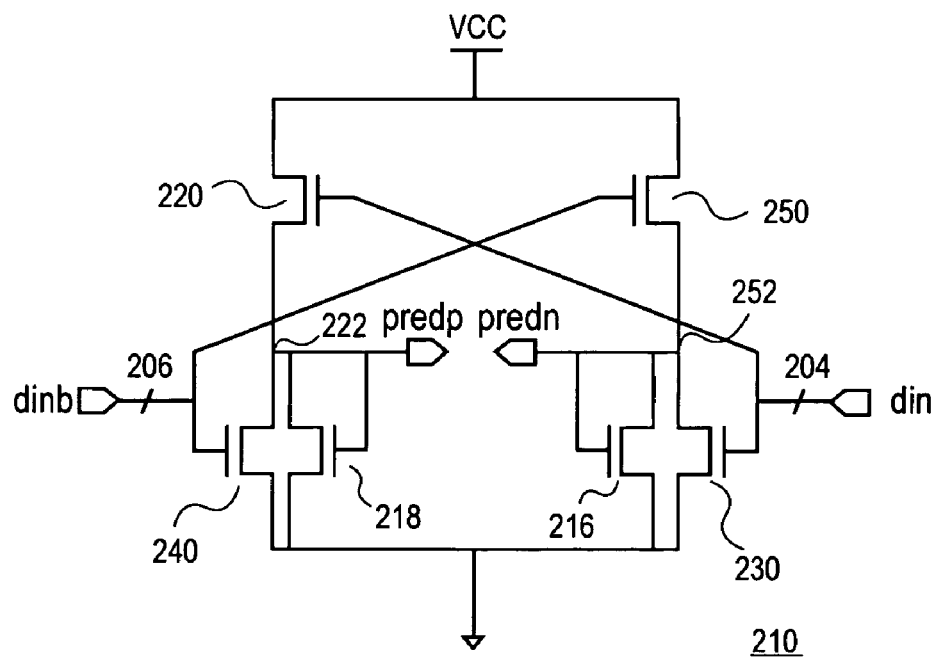
FIG. 4 is a block diagram further illustrating the predriver of FIG. 3, in accordance with one embodiment.

In one embodiment, maintaining a stable, high output voltage on predp signal 212 and predn signal 214, is achieved by adding leaker devices (216 and 218) to connect predp and predn nodes 222 and 252 to ground (See FIG. 4). A small amount of current is drawn through the devices 216 and 218, to counter voltage drift from sub-threshold leakage of pull-up devices 220 and 250. Accordingly, reduction of the output swing to a minimal level required for driver switch gate turn-off provides a practical means of controlling the energy imparted from the predriver signal to the output pad (290 and 292).

Representatively, NMOS-based predriver 210 produces a distortion-free output signal, because the signal inputs (din 204 and dinb 206) into the pullup gates (220 and 250) and pulldown gates (230 and 240) driving the predriver output node (predp 222 or predn 252) are driven in opposite directions. The net charge transfer through the gate to source capacitance of the pullup devices 220 and 250 and gate to drain capacitance of pulldown devices 230 and 240 is approximately zero, since each gate it driven in opposing polarity. Conversely, in the case of a simple inverter, both the PMOS and NMOS gates are pulled in the same direction, creating a glitch on the output signal in the opposite direction of the output signal swing.

Figure 5:
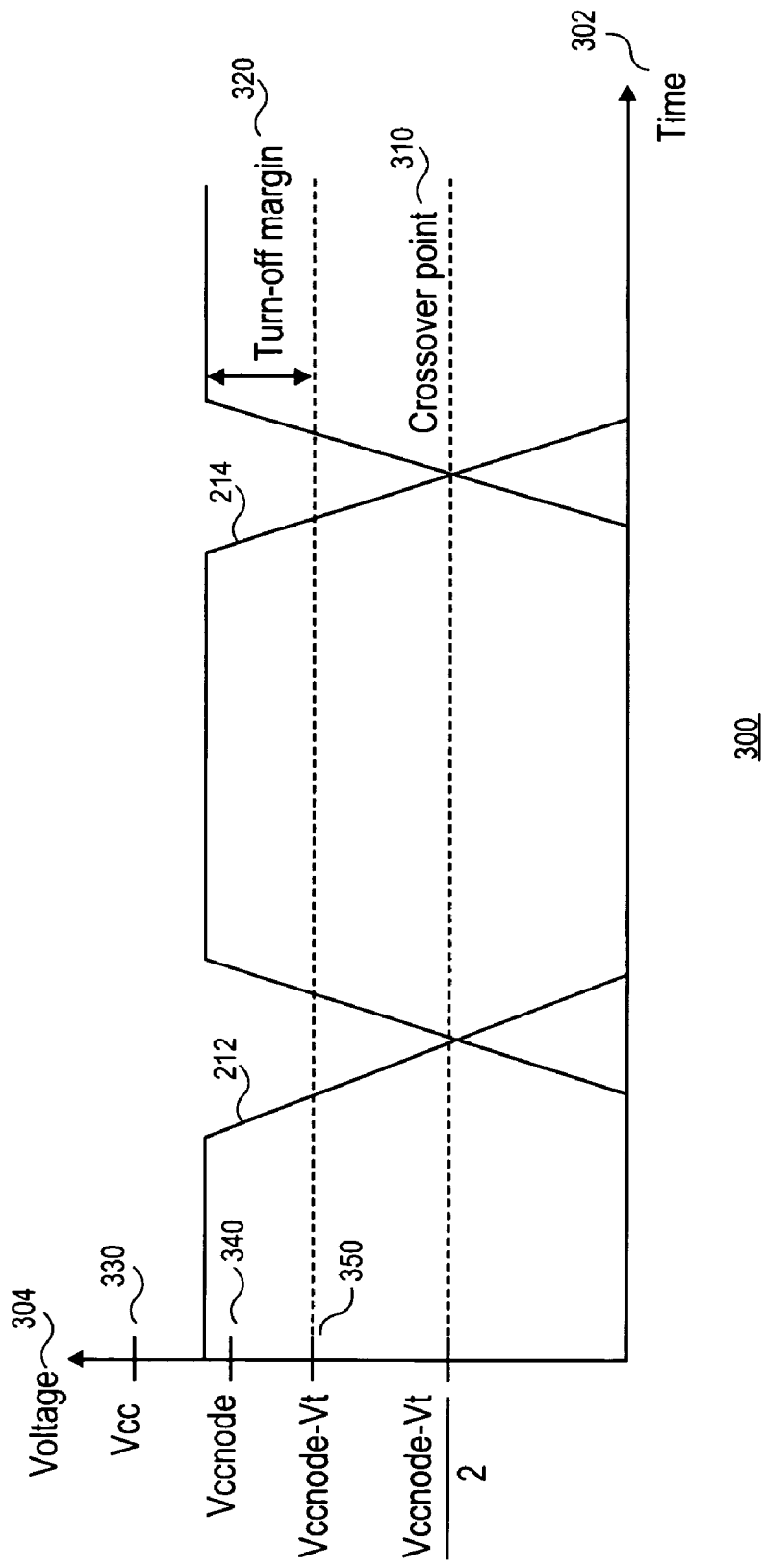
FIG. 5 is a signal diagram illustrating a differential predriver signal pair, as generated by the predriver of FIG. 3, in accordance with one embodiment.

FIG. 5 is a signal diagram 300 illustrating waveforms generated by predriver 210 as a differential predriver signal pair (212 and 214), in accordance with one embodiment. Representatively, positive predriver signal (predp) 212 and complement predriver signal (predn) 214 are generated to have equal rise/fall slew rates. As described herein, slew rate refers to the amount of time required for completion of a rising signal transition or a falling signal transition. Furthermore, in one embodiment, predp 212 and predn signal 214 have simultaneously starting rise/fall transitions.

Representatively, equal rise/fall slew rates associated the predp and predn signals 212 and 214 will cancel any net charge transfer to ccnode 268 (FIG. 2). Furthermore, equal rise/fall slew rates will ensure that any noise transfer to output pads 290 and 292 is differential. In one embodiment, the turn off margin 320 occurs once a gate voltage rises above $V_{cc}$ node-$V_t$. Excessive turn off margin beyond $V_{cc}$ node-$V_t$ is undesirable, since the controlled PMOS device 270/280 (FIG. 2) is already in an off-state. Additional predp/predn swing above $V_{cc}$ node-$V_t$ couples noise to ccnode and the associated output pad.

As further illustrated, the predp and predn signals 212 and 214 rise to a direct current (DC) high level within one unit interval to eliminate any intersymbol interference (ISI). A finite skew between predp signal 212 and predn signal 214 achieves a low crossover voltage. The relative sizes of NMOS devices 220/250 and 230/240 (FIG. 2) control the DC high level and the crossover voltage.

Furthermore, limiting the signal swing keeps the unbalanced portion of the signal swing to a minimum. Representatively, predriver 210 maintains a low crossover point, which is limited in voltage swing to what is necessary to turn on/off line driver switches 270 and 280. In one embodiment, crossover point 310 occurs at approximately a value of ($V_{cc}$ node-$V_t$)÷2. Representatively, having crossover point 310 at a voltage equal to ($V_{cc}$ node-$V_t$)÷2 prevents simultaneous shutoff of both devices (270 and 280—FIG. 2) to eliminate jitter in the output differential signal pair 290 and 292.

Accordingly, as illustrated in FIG. 5, an extremely simple approach (employing NMOS devices as pullups rather than PMOS devices) is used to overcome the drawbacks associated with previous predriver architectures. Predriver 210 eliminates sensitivity to silicon cross-skew (P versus N relative strength) by using NMOS devices. Namely, the output voltage crossover point 310 is controlled by the relative strengths of the pullup and pulldown transistors—both NMOS devices which in one embodiment are processed identically during manufacturing. This results in an extremely stable crossover voltage. The design also allows the tri-stating of the predriver signal (a unique feature), providing more flexibility for driver enabling/disabling for sleep and power management modes.

Figure 6:
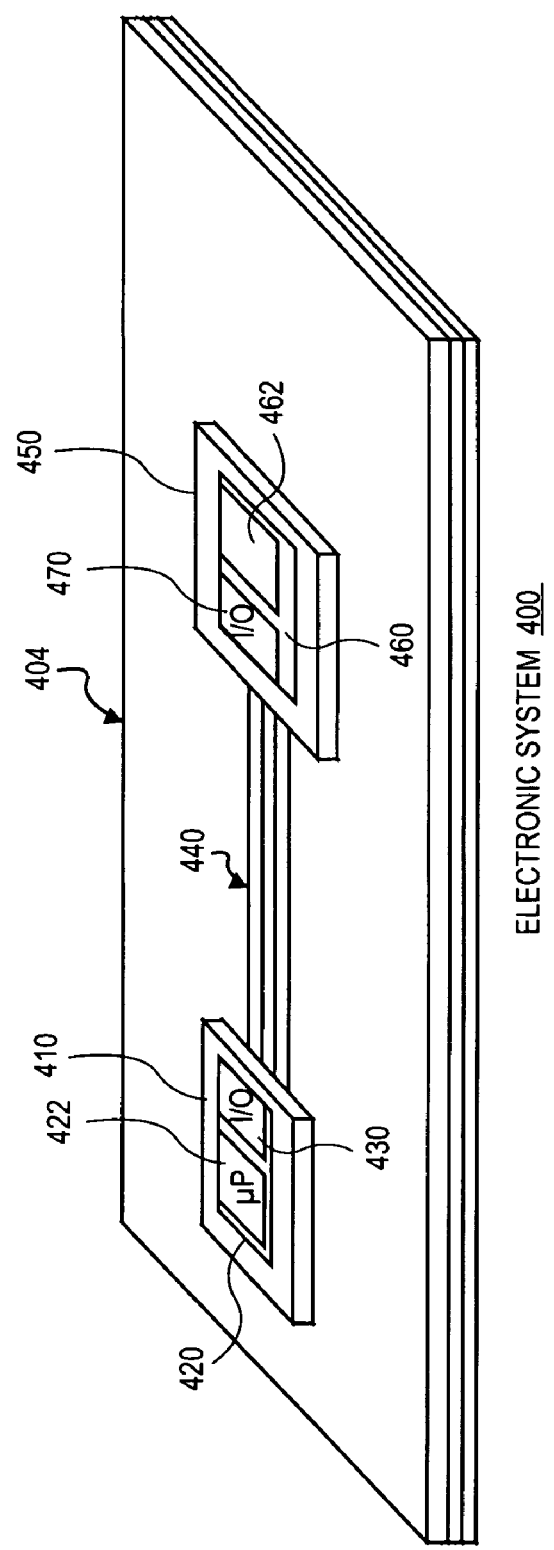
FIG. 6 depicts a block diagram of an electronic system in which a communications link features a predriver for a differential output driver, in accordance with one embodiment.

FIG. 6 is a block diagram of an embodiment of electronic system 400 in which a communication link features a differential output driver as described above. System 400 includes multi-layer printed wiring board 404 on which bus (interconnect) 440 is formed. The bus 440 may be of a point-to-point variety bus or serial interconnect, such as those used in communication with a CPU. Integrated circuit (IC) chip package 410 is operatively installed on board 404 to communicate using bus 440. The installation of package 410 may be done by a surface mount technique or via a connector of socket.

In one embodiment, package 410 includes IC chip 420 that includes logic function section 422 and I/O section 430 as an interface between the logic function section 422 and bus 440. Logic function section 422 may be one of the following well-known devices: a microprocessor, chipset, I/O controller, system controller, a memory controller and a bus bridge. Alternatively, other devices that can be implemented in a logic function section of an IC chip may be used. In one embodiment, I/O section 430 has an interface in which a differential output driver, as described above, includes a predriver and a line driver, for example, as illustrated in FIGS. 2–4.

Representatively, second IC package 450 is also installed on the board 404 to communicate with first package 410 via bus 440. In one embodiment, second IC package 450 also includes IC chip 460. In one embodiment, IC chip (chipset) 460 includes logic function section 462 and I/O section 470 (driver/receiver) as an interface between logic function section 462 and bus 440. Logic function 462 may be one of the following well-known devices: a microprocessor, a memory controller, an I/O controller hub, an integrated driver electronics (IDE) output driver, or the like. Alternatively, other devices that can be implement in a logic function section of an IC chip may be used.

In the embodiment described, I/O section 462 includes a chipset driver which utilizes a low jitter predriver for a differential output line driver to limit signal crossover point variation and to produce a low signal swing for turning on output line driver switches to generate a differential output driver signal pair. In one embodiment, I/O interfaces (430, 470) of IC chips 410 and 450 communicate with each other bidirectionally, that is using the same conductive lines of the bus for both transmitting and receiving data. Thus, in such an embodiment, output drivers including the predriver and line driver, as described above, are provided, in both IC chip I/O section 430 and 470, that are connection to the same conductive lines of the bus 440. Other system applications of the low jitter predriver for differential output drivers are possible, including, for example, an I/O device driver.

Figure 7:
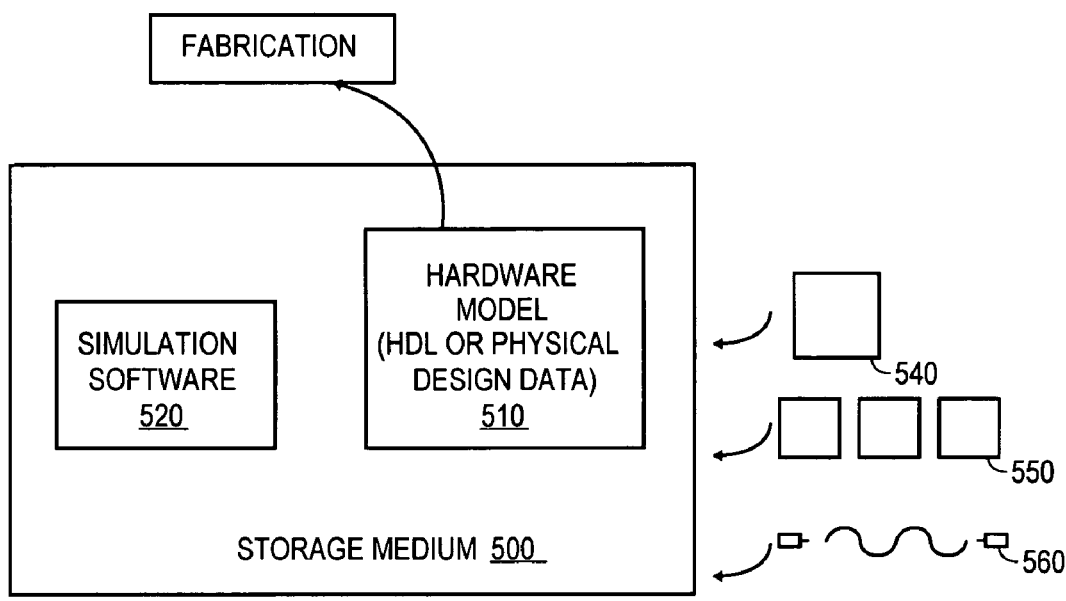
FIG. 7 is a block diagram illustrating various design representations or formats for simulation, emulation and fabrication of a design using the disclosed techniques.

FIG. 7 is a block diagram illustrating various representations or formats for simulation, emulation and fabrication of a design using the disclosed techniques. Data representing a design may represent the design in a number of manners. First, as is useful in simulations, the hardware may be represented using a hardware description language, or another functional description language, which essentially provides a computerized model of how the designed hardware is expected to perform. The hardware model 510 may be stored in a storage medium 500, such as a computer memory, so that the model may be simulated using simulation software 520 that applies a particular test suite 530 to the hardware model to determine if it indeed functions as intended. In some embodiments, the simulation software is not recorded, captured or contained in the medium.

In any representation of the design, the data may be stored in any form of a machine readable medium. An optical or electrical wave 560 modulated or otherwise generated to transport such information, a memory 550 or a magnetic or optical storage 540, such as a disk, may be the machine readable medium. Any of these media may carry the design information. The term "carry" (e.g., a machine readable medium carrying information) thus covers information stored on a storage device or information encoded or modulated into or onto a carrier wave. The set of bits describing the design or a particular of the design are (when embodied in a machine readable medium, such as a carrier or storage medium) an article that may be sealed in and out of itself, or used by others for further design or fabrication.

Accordingly, the ability to transmit signals with low jitter is important to maintaining the steady march to higher I/O speeds. Using a differential predriver in accordance with one embodiment reduces jitter by almost an order of magnitude in comparison to previous predriver architectures used for serial data drivers. Output drivers using a predriver in accordance with one embodiment have been shown to scale very well in frequency, and appears capable of meeting predriver requirements for links running at up to 20 GHz. Temporal stability of the crossover point is exceptional with the NMOS-based design. Analysis has shown that up to 200 mV of Vcc variation across one bit cycle only results in 0.4 pico second (ps) of jitter increase. Conventional predriver architectures currently will introduce upwards of 5 ps jitter with this magnitude of Vcc modulation.

Furthermore, the layout area of an output driver using a predriver in accordance with one embodiment is significantly smaller than previous designs. The estimated silicon area savings is ~70% compared to other predriver architectures (the predriver typically constitutes 10%–20% of an I/O cell size). Furthermore, current consumption is lower with this proposed architecture, than with previous implementations. Root mean square (RMS) current is ~60% lower, and peak current is 20% lower than predriver architecture used on conventional interfaces such as universal serial bus-2 (USB2), serial advanced technology attachment (SATA) and peripheral component interconnect (PCI) express or other like interconnect protocol.

Alternate Embodiments

It will be appreciated that, for other embodiments, a different system configuration may be used. For example, while the system 100 includes a single CPU 102, for other embodiments, a multiprocessor system (where one or more processors may be similar in configuration and operation to the CPU 102 described above) may benefit from the low jitter predriver for differential output drivers of various embodiments. Further different type of system or different type of computer system such as, for example, a server, a workstation, a desktop computer system, a gaming system, an embedded computer system, a blade server, etc., may be used for other embodiments.

Having disclosed exemplary embodiments and the best mode, modifications and variations may be made to the disclosed embodiments while remaining within the scope of the embodiments of the invention as defined by the following claims.

What is claimed is:

1. A predriver circuit for a differential output driver comprising:
    a pull-up circuit having at least one pull-up device of a first device type; and
    a pull-down circuit including at least one pull-down device of the first device type having a source coupled to ground and a gate coupled to a gate of the pull-up device, the pull-up circuit and the pull-down circuit to charge an output node and a complement output node in opposite directions to generate a low swing differential predriver signal pair to open/close a pair of line driver switches of the output driver of a second device type to generate a differential output driver signal pair for a pair of output pads coupled to the pair of line driver switches to provide the differential output driver signal pair onto a motherboard for communication over a serial interconnect.

2. The predriver circuit of claim 1, wherein the pull-up device is cross-coupled to the pull-down device.

3. The predriver circuit of claim 1,
    wherein the pull-up device and the pull-down device comprise NMOS devices; and
    wherein the pair of line driver switches comprise PMOS devices.

4. The predriver circuit of claim 1, wherein the pull-up circuit comprises:
    a first pull-up device having a gate coupled to a data input signal, a drain coupled to a power supply and a source coupled to the output node; and
    a second pull-up device having a gate coupled to a complement input signal, a drain coupled to the power supply and a source coupled to the complement output node.

5. The predriver circuit of claim 1, wherein the pull-down circuit comprises:
    a first pull-down device having a gate coupled to a complement input signal, a drain coupled to the output node and a source coupled to ground; and
    a second pull-down device having a gate coupled to a data input signal, a drain coupled to the complement output node and a source coupled to ground.

6. The predriver circuit of claim 1, wherein the pull-down circuit further comprises:
    a first device coupled between the output node and ground; and
    a second device coupled between the complement output node and ground.

7. The predriver circuit of claim 6, wherein the first device comprises:
    a gate and a drain coupled to the output node; and
    a source coupled to ground.

8. The predriver circuit of claim 6, wherein the second device comprises:
    a gate and a drain coupled to the complement output node and a source coupled to ground.

9. The predriver circuit of claim 2, further comprising:
    a first pull-up device cross-coupled to a first pull-down device to receive a data input signal and to charge the output node and the complement output node in opposite directions; and
    a second pull-up device cross-coupled to a second pull-down device to receive a complement data input signal and to charge the output node and the complement output node in opposite directions to generate the differential predriver signal pair.

10. The predriver circuit of claim 9, wherein the first and second pull-up devices comprise NMOS devices and the first and second pull-down devices comprise NMOS devices.

11. An output driver circuit, comprising:
    a predriver circuit including:
        a pull-up circuit having at least one pull-up device of a first device type, and
        a pull-down circuit including at least one pull-down device of the first device type having a source coupled to ground and a gate coupled to a gate of the pull-up device, the pull-up circuit and the pull-down circuit to charge an output node and a complement output node in opposite directions to generate a differential predriver signal pair, including a predriver signal and a complement predriver signal; and a line driver including:
  a first switch of a second device type to generate a complement output driver signal in response to the predriver signal,
  a second switch of the second device type to generate an output driver signal in response to the complement predriver signal,
  a first output pad coupled to the first switch to provide the complement output driver signal onto a motherboard for communication over a serial interconnect, and
  a second output pad coupled to the second switch to provide the output driver signal onto the motherboard for communication over the serial interconnect.

12. The output driver circuit of claim 11, wherein the pull-up device is cross-coupled to the pull-down device.

13. The output driver circuit of claim 11,
  wherein the pull-up device and the pull-down device comprise NMOS devices, and
  wherein the first and second switches comprises PMOS devices.

14. The output driver circuit of claim 11, wherein the pull-up circuit comprises:
  a first pull-up device having a gate coupled to a data input signal, a drain coupled to a power supply and a source coupled to the output node; and
  a second pull-up device having a gate coupled to a complement input signal, a drain coupled to a power supply and a source coupled to the complement output node.

15. The output driver circuit of claim 11, wherein the pull-down circuit comprises:
  a first pull-down device having a gate coupled to a complement input signal, a drain coupled to the output node and a source coupled to ground; and
  a second pull-down device having a gate coupled to a data input signal, a drain coupled to the complement output node and a source coupled to ground.

16. The output driver circuit of claim 11, wherein the pull-down circuit further comprises:
  a first device coupled between the output node and ground; and
  a second device coupled between the complement output node and ground.

17. The output driver circuit of claim 16, wherein the first device comprises:
  a gate and a drain coupled to the output node; and
  a source coupled to ground.

18. The output driver circuit of claim 16, wherein the second device comprises:
  a gate and a drain coupled to the complement output node and a source coupled to ground.

19. The output driver circuit of claim 12, further comprising:
  a first pull-up device cross-coupled to a first pull-down device to receive a data input signal and to charge an output node and a complement output node in opposite directions; and
  a second pull-up device cross-coupled to a second pull-down device to receive a complement data input signal and to charge the output node and the complement output node in opposite directions to generate the differential predriver signal pair.

20. The output driver of claim 9, wherein the first and second pull-up devices comprise NMOS devices and the first and second pull-down devices comprise NMOS devices.

21. An electronic system comprising:
  a motherboard on which a serial interconnect is formed, an integrated circuit (IC) chip package being operatively installed on the board to communicate using the serial bus, the package having an IC chip that includes a logic function section and an I/O section as an interface between the logic function section and the serial bus, the I/O section having an output driver in which a pre-driver includes a pull-up circuit having at least one pull-up device of a first device type, and a pull-down circuit having at least one pull-down device of the first device type including a source coupled to ground, the pull-up circuit and the pull-down circuit to charge an output node and a complement output node in opposite directions to generate a differential pre-driver signal pair to open/close a pair of line driver switches to generate a differential output driver signal pair for a pair of output pads coupled to the pair of line driver switches to provide the differential output driver signal pair onto the motherboard for communication over the serial interconnect,
  wherein the pull-up device is cross-coupled to the pull-down devices, and
  wherein the pair of line driver switches are of a second device type.

22. The electronic system of claim 21, wherein the logic function section is a microprocessor.

23. The electronic system of claim 21, wherein the logic function section is a memory controller.

24. The electronic system of claim 21, wherein the logic function section is a bus bridge.

25. The electronic system of claim 21, wherein the logic function section is an I/O controller.

26. An article comprising a machine readable carrier medium carrying data which, when loaded into a computer system memory in conjunction with simulation routines, provides functionality of a predriver circuit for a differential output driver comprising:
  a pull-up circuit having at least one pull-up device of a first device type; and
  a pull-down circuit including at least one pull-down device of the first device type having a source coupled to ground and a gate coupled to a gate of the pull-up device, the pull-up circuit and the pull-down circuit to charge an output node and a complement output node in opposite directions to generate a differential pre-driver signal pair to open/close a pair of line driver switches of the output driver of a second device type to generate a differential output driver signal pair for a pair of output pads coupled to the pair of line driver switches to provide the differential output driver signal pair onto a motherboard for communication over a serial interconnect.

27. The article of claim 26, wherein the pull-down device is cross-coupled to the pull-down device.

28. The article of claim 26,
  wherein the pull-up device and the pull-down device comprise NMOS devices, and
  wherein the pair of line driver switches comprises PMOS devices.

29. The article of claim 26, further comprising:
  a first pull-up device cross-coupled to a first pull-down device to receive a data input signal; and a second pull-up device cross-coupled to a second pull-down device to receive a complement data input signal.

30. The article of claim 26, wherein the first and second pull-up devices comprise NMOS devices and the first and second pull-down devices comprise NMOS devices.

31. A system comprising:
at least one processor; and
a chipset coupled to the processor via a serial interconnect, the chipset comprising:
an output differential driver including:
a predriver circuit comprising:
a pull-up circuit having at least one pull-up device of a first device type,
a pull-down circuit including at least one pull-down device of the first device type having a source coupled to ground, the pull-up circuit and the pull-down circuit to charge an output node and a complement output node in opposite directions to generate a differential predriver signal pair including a predriver signal and a complement predriver signal, and
a line driver comprising:
a first switch of a second device type to generate a complement output driver signal in response to the predriver signal,
a second switch of the second device type to generate an output driver signal in response to the complement predriver signal,
a first output pad coupled to the first switch to provide the complement output driver signal onto the chipset for communication over the serial interconnect, and
a second output pad coupled to the second switch to provide the output predriver signal onto the chipset for communication over the serial interconnect.

* * * * *